United States Patent
Liang et al.

(10) Patent No.: US 10,501,664 B1
(45) Date of Patent: Dec. 10, 2019

(54) RESIN COMPOSITON, REMOVABLE ADHESIVE LAYER, IC SUBSTRATE, AND IC PACKAGING PROCESS

(71) Applicant: Qi Ding Technology Qinhuangdao Co., Ltd., Qinhuangdao (CN)

(72) Inventors: Kuo-Sheng Liang, Taoyuan (TW); Mei-Ju Pan, Taoyuan (TW); Mao-Feng Hsu, Taoyuan (TW); Yu-Cheng Huang, Taoyuan (TW)

(73) Assignee: Qi Ding Technology Qinhuangdao Co., Ltd., Qinhuangdao (CN)

( * ) Notice: Subject to any disclaimer, the term of this patent is extended or adjusted under 35 U.S.C. 154(b) by 0 days.

(21) Appl. No.: 16/128,628

(22) Filed: Sep. 12, 2018

(30) Foreign Application Priority Data

May 15, 2018 (TW) .............................. 107116384 A (51) Int. Cl.
| | |
|---|---|
| C09J 153/02 | (2006.01) |
| H01L 21/56 | (2006.01) |
| H01L 21/683 | (2006.01) |
| C08K 3/22 | (2006.01) |
| C08K 5/07 | (2006.01) |
| C08K 7/16 | (2006.01) |

(52) U.S. Cl.
CPC .............. *C09J 153/02* (2013.01); *C08K 3/22* (2013.01); *C08K 5/07* (2013.01); *C08K 7/16* (2013.01); *H01L 21/568* (2013.01); *H01L 21/6835* (2013.01); *C08K 2003/2224* (2013.01); *C08K 2003/2227* (2013.01)

(58) Field of Classification Search
CPC ..................................... C09J 153/02
See application file for complete search history.

(56) References Cited

FOREIGN PATENT DOCUMENTS

| | | |
|---|---|---|
| TW | 201707056 A | 2/2017 |
| TW | 201718752 A | 6/2017 |

*Primary Examiner* — Marvin Payen
(74) *Attorney, Agent, or Firm* — ScienBiziP, P.C.

(57) ABSTRACT

A resin composition comprises a styrene-butadiene-styrene block copolymer. The resin composition further comprises a plurality of hydrated inorganic substances and/or a plurality of microcapsule particles dispersed in the styrene-butadiene-styrene block copolymer. The hydrated inorganic substances dehydration to form anhydrous inorganic substances at a dehydration temperature greater than 250 degrees Celsius. Each microcapsule particle comprises a housing and an embedded object encapsulated in the housing. The embedded object will largely volatilize from the housing at an escaping temperature greater than 250 degrees Celsius. A removable adhesive layer, an IC substrate, and an IC packaging process are also provided.

20 Claims, 9 Drawing Sheets

RESIN COMPOSITON, REMOVABLE ADHESIVE LAYER, IC SUBSTRATE, AND IC PACKAGING PROCESS

FIELD

The subject matter herein generally relates to a resin composition, a removable adhesive layer, an integrated circuit (IC) substrate, and an IC packaging process.

BACKGROUND

Because flexible circuit board is soft, the flexible circuit board need to combine with a rigid substrate by an adhesive layer to improve mechanical property before the integrated circuit is mounted on the flexible circuit board by surface mount technology. However, the conventional adhesive layer will peel off or even become brittle at a temperature less than the temperature of the surface mount technology.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

An exemplary embodiment of a resin composition comprises a styrene-butadiene-styrene block copolymer. The resin composition further comprises a plurality of hydrated inorganic substances and/or a plurality of microcapsule particles dispersed in the styrene-butadiene-styrene block copolymer. The hydrated inorganic substances form anhydrous inorganic substances by chemical dehydration at a dehydration temperature greater than 250 degrees Celsius. Each microcapsule particle comprises a housing and an embedded object encapsulated therein. The embedded object will largely volatilize from the housing at an escaping temperature greater than 250 degrees Celsius.

In at least one embodiment, the resin composition comprises 100 parts by weight of the styrene-butadiene-styrene block copolymer, at least one of about 1 part by weight to about 50 parts by weight of the hydrated inorganic substances and about 5 parts by weight to about 50 parts by weight of the microcapsule particles.

In at least one embodiment, the styrene-butadiene-styrene block copolymer has a chemical structural formula of wherein the degree of polymerization x is about 30 to about 90, the degree of polymerization y is about 10 to about 70, the degree of polymerization m and the degree of polymerization n each is a natural number greater than 1.

In at least one embodiment, the hydrated inorganic substances can be selected from at least one of aluminum hydroxide and magnesium hydroxide. The embedded object can be selected from at least one of essence and essential oil. For example, the embedded object can be cis-Jasmone.

Each microcapsule particle has a diameter of about 3 μm to about 12 μm.

Figure 1:
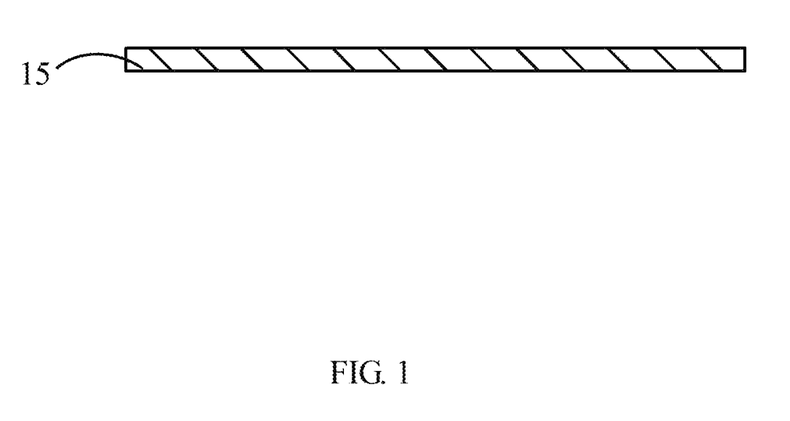
FIG. 1 is a cross-sectional view of an embodiment of a removable adhesive layer.

FIG. 1 illustrates an embodiment of a removable adhesive layer 15 made by curing the resin composition. At least one embodiment, the resin composition is cured for 15 mins at 110 degrees Celsius to form the removable adhesive layer 15. The removable adhesive layer 15 is a semi-cured layer.

In at least one embodiment, the resin composition comprises the hydrated inorganic substances or the microcapsule particles. When a temperature of the removable adhesive layer 15 is less than the dehydration temperature or the escaping temperature, the styrene-butadiene-styrene block copolymer in the removable adhesive layer 15 further will react with each other, to reduce an adhesion of the removable adhesive layer 15 and prevent the removable adhesive layer 15 from becoming brittle. When the temperature of the removable adhesive layer 15 is greater than or equal to the dehydration temperature or the escaping temperature, gas is produced from the hydrated inorganic substances in the removable adhesive layer 15 and/or the microcapsule particles in the removable adhesive layer 15. The gas is released from the removable adhesive layer 15, to cause the removable adhesive layer 15 to be peeled off more easily, and prevent residue of the removable adhesive layer 15 from remaining.

In another embodiment, the resin composition comprises the hydrated inorganic substances and the microcapsule particles. When a temperature of the removable adhesive layer 15 is less than the dehydration temperature and/or the escaping temperature, the styrene-butadiene-styrene block copolymer in the removable adhesive layer 15 further will react with each other, to reduce an adhesion of the removable adhesive layer 15 and prevent the removable adhesive layer 15 from becoming brittle. When the temperature of the removable adhesive layer 15 is greater than or equal to the dehydration temperature and the escaping temperature, gas is produced from the hydrated inorganic substances in the removable adhesive layer 15 and/or the microcapsule particles in the removable adhesive layer 15. The gas is released from the removable adhesive layer 15, to cause the removable adhesive layer 15 to be peeled off more easily, and prevent residue of the removable adhesive layer 15 from remaining.

Figure 2:
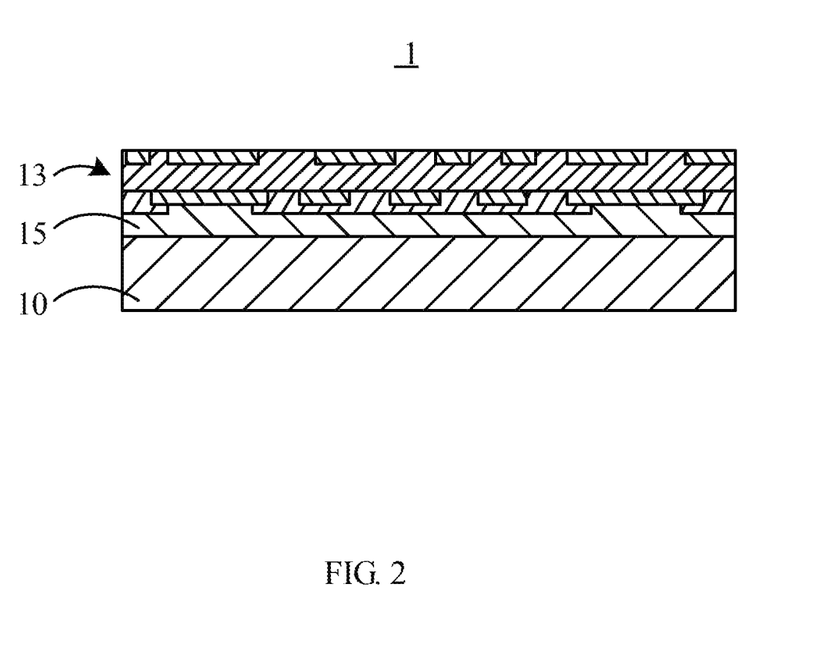
FIG. 2 is a cross-sectional view of an embodiment of an integrated circuit (IC) substrate comprising the removable adhesive layer of FIG. 1.

FIG. 2 illustrates an embodiment of an integrated circuit (IC) substrate 1. The IC substrate 1 comprises a carrier 10, a circuit structure 13, and the removable adhesive layer 15 attached between the carrier 10 and the circuit structure 13.

Figure 3:
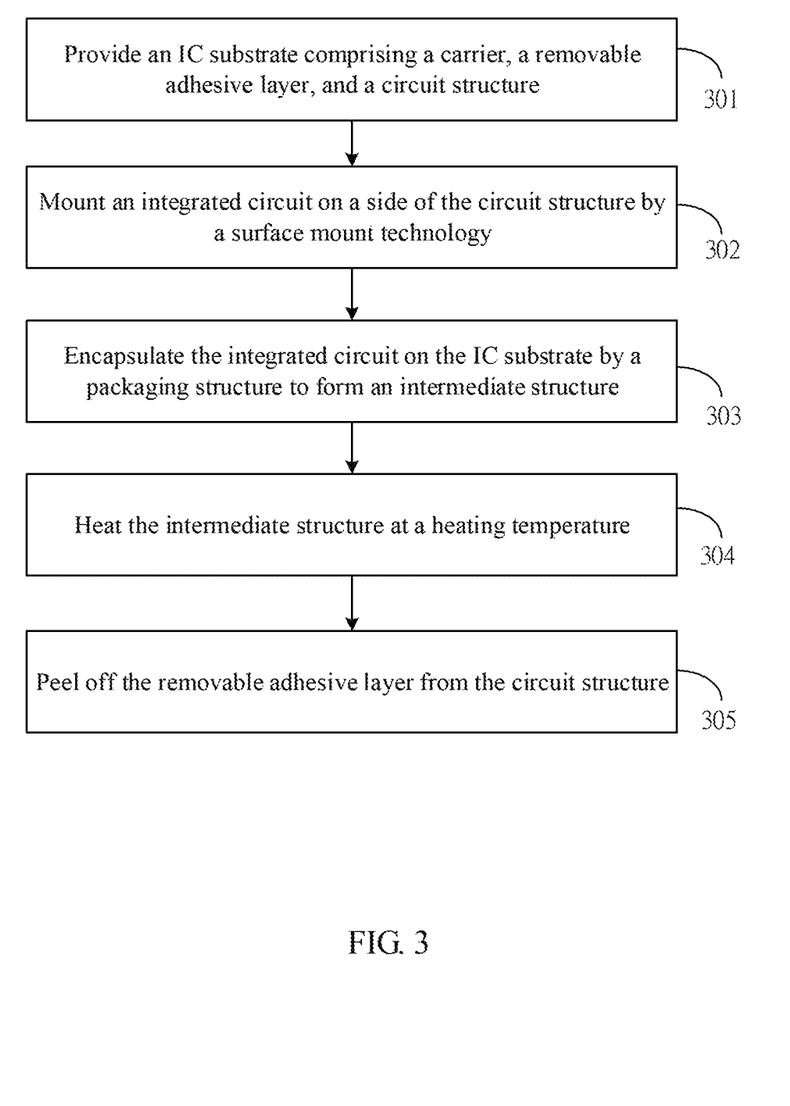
FIG. 3 is a flowchart of an embodiment of an IC packaging process.

FIG. 3 illustrates a flowchart of an IC packaging process using the resin composition in accordance with an exemplary embodiment. The exemplary IC packaging process is provided by way of example, as there are a variety of ways to carry out the method. Each block shown in the figure represents one or more processes, methods, or subroutines, carried out in the exemplary method. Furthermore, the illustrated order of blocks is by example only, and the order of the blocks can change. Additional blocks may be added, or fewer blocks may be utilized, without departing from this disclosure. The exemplary IC packaging process can begin at block 301.

At block 301, referring to FIG. 2, an IC substrate 1 is provided. The IC substrate 1 comprises a carrier 10, a circuit structure 13, and the removable adhesive layer 15 attached between the carrier 10 and the circuit structure 13.

Figure 4:
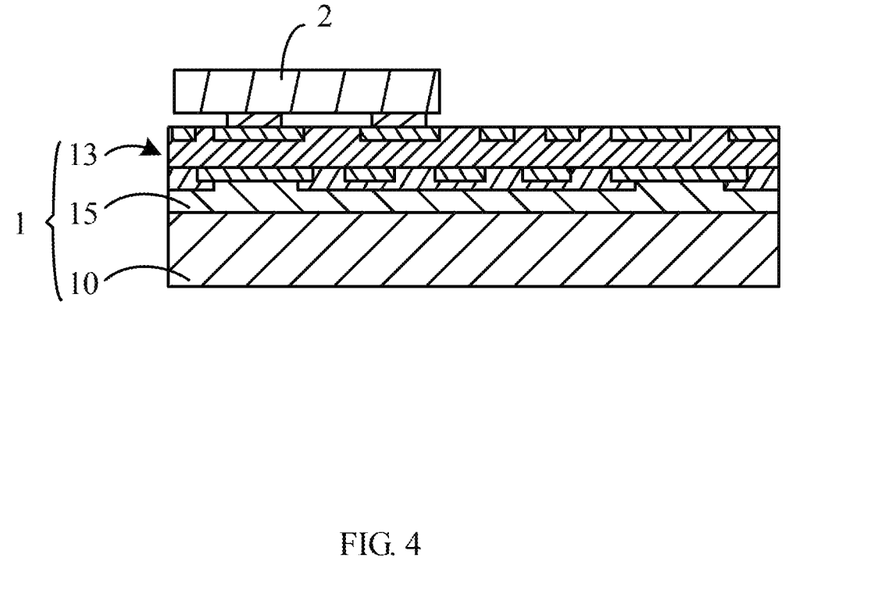
FIG. 4 is a cross-sectional view showing an integrated circuit mounted on a side of the IC substrate of FIG. 2.

At block 302, referring to FIG. 4, an integrated circuit 2 is mounted on a side of the circuit structure 13 facing away from the carrier 10 by surface mount technology. The surface mount technology applies in a mounting temperature of about 250 degrees Celsius, and each of the dehydration temperature and the escaping temperature is greater than the mounting temperature of the surface mount technology. So that, the styrene-butadiene-styrene block copolymer in the removable adhesive layer 15 further will react with each other, to reduce an adhesion of the removable adhesive layer 15 and prevent the removable adhesive layer 15 from becoming brittle.

Figure 5:
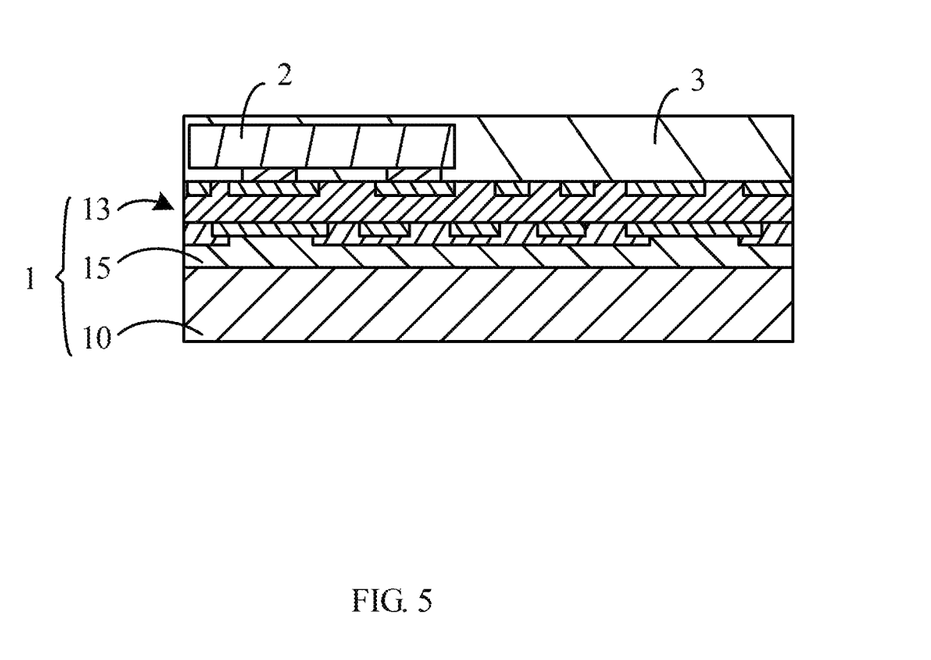
FIG. 5 is a cross-sectional view showing the integrated circuit of FIG. 4 encapsulated on the IC substrate by a packaging structure to form an intermediate structure.

At block 303, referring to FIG. 5, the integrated circuit 2 is encapsulated on the IC substrate 1 by a packaging structure 3, thereby forming an intermediate structure 6.

In at least one embodiment, the packaging structure 3 is formed on the side of the IC substrate 1 with the integrated circuit 2 directly by a molding techniques.

At block 304, when the removable adhesive layer 15 comprises the hydrated inorganic substances or the microcapsule particles, the intermediate structure 6 is heated by a temperature greater than or equal to the dehydration temperature or the escaping temperature. Gas is produced by the hydrated inorganic substances or the microcapsule particles, and releases from the removable adhesive layer 15, to cause the removable adhesive layer 15 to be peeled off more easily, and prevent residue of the removable adhesive layer 15 from remaining. When the removable adhesive layer 15 comprises the hydrated inorganic substances and the microcapsule particles, the intermediate structure 6 is heated by a temperature greater than or equal to the dehydration temperature and the escaping temperature, so gas is produced by the hydrated inorganic substances and the microcapsule particles, and releases from the removable adhesive layer 15, to cause the removable adhesive layer 15 to be peeled off more easily, and prevent residue of the removable adhesive layer 15 from remaining.

Figure 6:
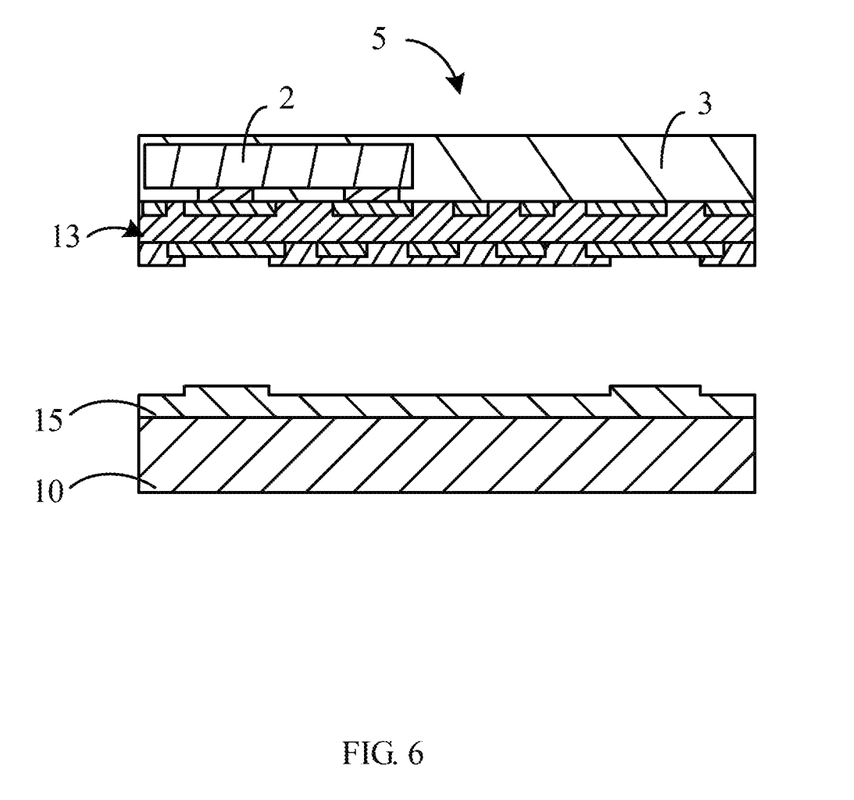
FIG. 6 is a cross-sectional view showing an integrated circuit package board formed.

At block 305, referring to FIG. 6, the removable adhesive layer 15 is peeled off from the circuit structure 13 to obtain an integrated circuit package board 5. The circuit package board 5 comprises the circuit structure 13, the integrated circuit 2, and the packaging structure 3.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

EXAMPLE

A resin composition was made by adding 100 g of the styrene-butadiene-styrene block copolymer (Manufacturer: Kraton Polymers, Model: D1101) and 20 g of the microcapsule particles containing cis-Jasmone (Manufacturer: New Prismatic Enterprise Co. Ltd., Model: SS-PD 41104-1) into toluene, and stirring until the styrene-butadiene-styrene block copolymer was dissolved.

A removable adhesive layer 15 was made by coating the resin composition on a surface of a copper foil and heating the resin composition for 15 mins at 110 degrees Celsius. The removable adhesive layer 15 was attached to the copper foil.

Comparative Example 1

A resin composition was made by adding 100 g of the styrene-butadiene-styrene block copolymer (Manufacturer: Kraton Polymers, Model: D1101) into toluene, and stirring until the styrene-butadiene-styrene block copolymer was dissolved.

An adhesive layer 15 was made by coating the resin composition on a surface of a copper foil and heating the resin composition for 15 mins at 110 degrees Celsius. The adhesive layer 15 was attached to the copper foil.

Comparative Example 2

A resin composition (Manufacturer: Eternal Chemical Industry Co. Ltd., Model: ETERAC 7735P) was coated on a surface of a copper foil and heated to formed an adhesive layer.

A copper peeling strength of the removable adhesive layer of the example, the adhesive layers of comparative the examples 1 and 2 at normal temperature were tested, respectively. The same tests were carried out on the same subjects after heating for 5 mins at 230 degrees Celsius. The same tests were carried out on the same subjects after heating for 30 mins at 270 degrees Celsius. The test results are shown in Table 1.

TABLE 1

| Copper peeling strength (kgf/cm) | Products | | |
|---|---|---|---|
| | Example | Comparative example 1 | Comparative example 2 |
| At normal temperature | 0.5 | 0.8 | 0.7 |
| After heating for 5 mins at 230 degrees Celsius | 0.3 | 0.5 | embrittled and residue remaining |
| After heating for 30 mins at 270 degrees Celsius | less than 0.1 | 0.15 | embrittled and residue remaining |

Figure 7:
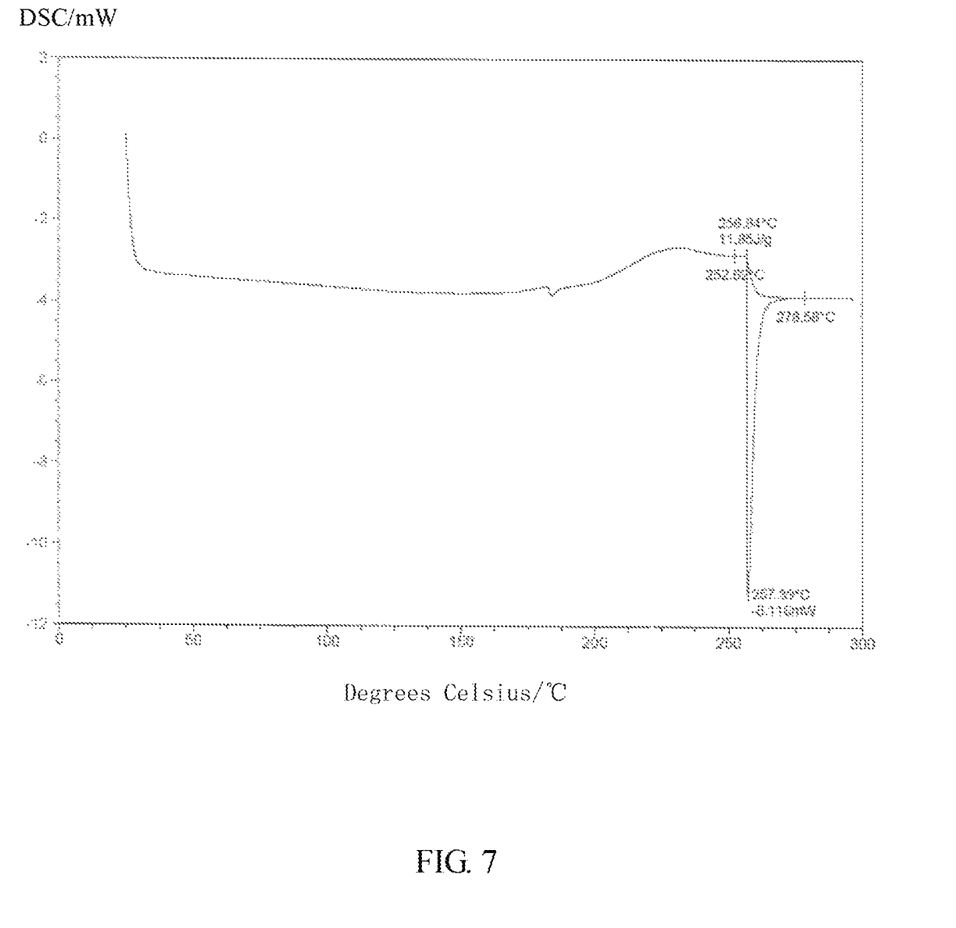
FIG. 7 is a DSC diagram of the removable adhesive layer of the example.
Figure 8:
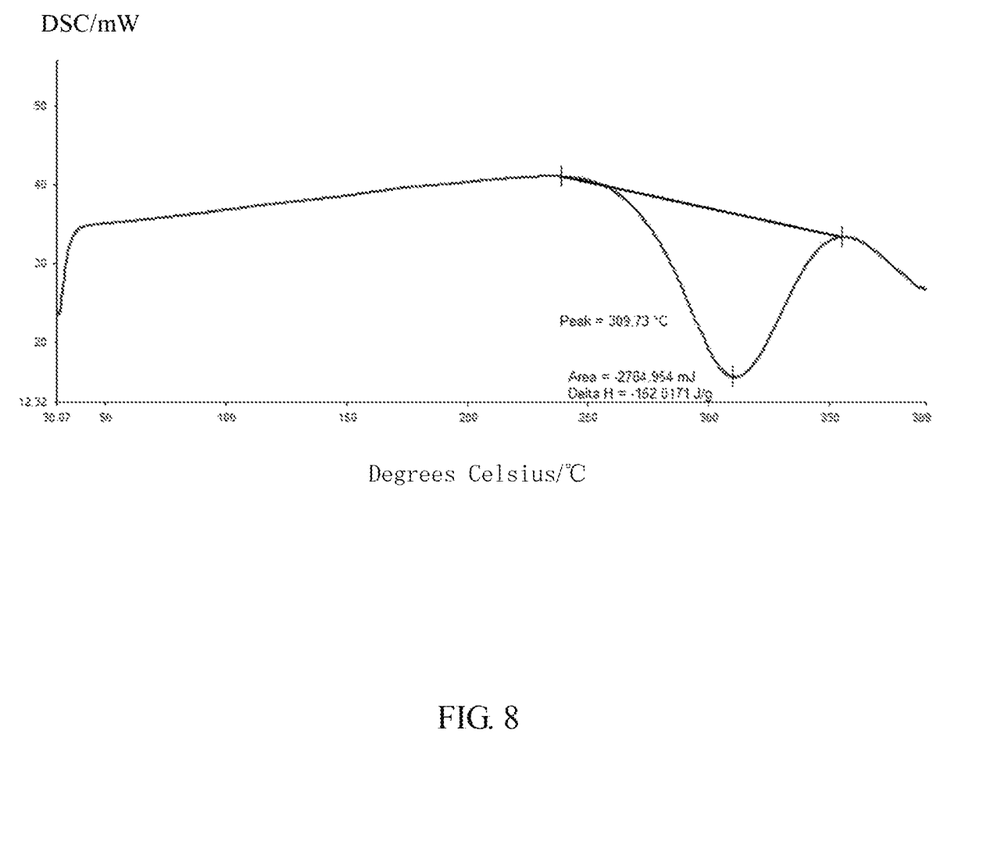
FIG. 8 is a DSC diagram of the adhesive layer of the comparative example 1.
Figure 9:
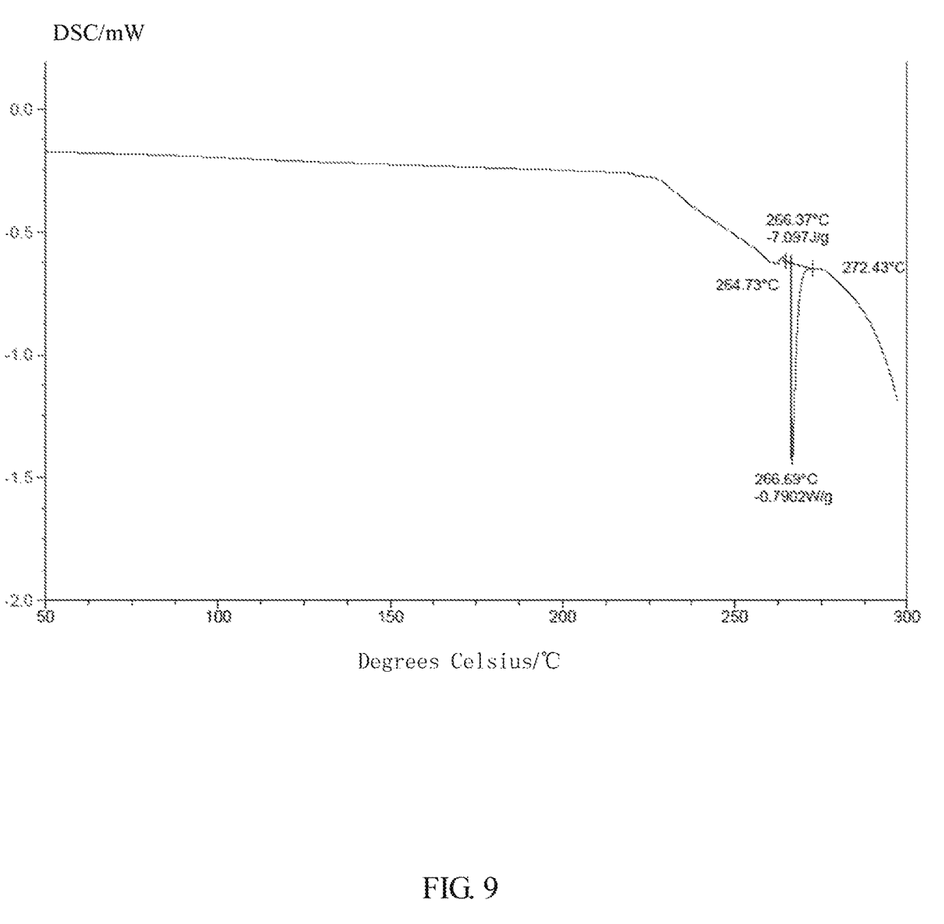
FIG. 9 is a DSC diagram of aluminum hydroxide.

FIG. 7 is a DSC diagram of the removable adhesive layer 15 of the example. FIG. 8 is a DSC diagram of the adhesive layer of the comparative example 1. FIG. 9 is a DSC diagram of aluminum hydroxide.

According to Table 1 and FIGS. 7, 8 and 9, the removable adhesive layer 15 of the example retains copper peeling strength after heated at 230 degrees Celsius and 270 degrees Celsius, which is less than the copper peeling strength of the adhesive layer of the comparative example 1 after heated at 230 degrees Celsius and 270 degrees Celsius. So that the removable adhesive layer 15 of the example can be removed more easily and without residue. The removable adhesive layer 15 of the example will not be peeled off when at a mounting temperature about 250 degrees Celsius of surface mount technology, but the adhesive layer of the comparative example 2 will be peeled off when at the mounting temperature about 250 degrees Celsius of surface mount technology.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A resin composition comprising:
   a styrene-butadiene-styrene block copolymer; and
   a plurality of hydrated inorganic substances and/or a plurality of microcapsule particles dispersed in the styrene-butadiene-styrene block copolymer
   wherein the plurality of hydrated inorganic substances dehydrate to form anhydrous inorganic substances at a dehydration temperature greater than 250 degrees Celsius, each of the plurality of microcapsule particle comprises a housing and an embedded object encapsulated therein, the embedded object will volatilize from the housing at an escaping temperature greater than 250 degrees Celsius.

2. The resin composition of claim 1, wherein the resin composition comprises 100 parts by weight of the styrene-butadiene-styrene block copolymer, at least one of 1 parts by weight to 50 parts by weight of the plurality of hydrated inorganic substances and 5 parts by weight to 50 parts by weight of the plurality of microcapsule particles.

3. The resin composition of claim 1, wherein the styrene-butadiene-styrene block copolymer has a chemical structural formula of a degree of polymerization x is about 30 to about 90, a degree of polymerization y is about 10 to about 70, a degree of polymerization m and a degree of polymerization n each is a natural number greater than 1.

4. The resin composition of claim 1, wherein the plurality of hydrated inorganic substances is selected from at least one of aluminum hydroxide and magnesium hydroxide.

5. The resin composition of claim 1, wherein the embedded object is cis-Jasmone.

6. The resin composition of claim 1, wherein each of the plurality of microcapsule particles has a grain diameter of about 3 μm to about 12 μm.

7. A removable adhesive layer formed by curing a resin composition, the resin composition comprising:
   a styrene-butadiene-styrene block copolymer; and
   a plurality of hydrated inorganic substances and/or a plurality of microcapsule particles dispersed in the styrene-butadiene-styrene block copolymer;
   wherein the plurality of hydrated inorganic substances dehydrate to form anhydrous inorganic substances at a dehydration temperature greater than 250 degrees Celsius, each of the plurality of microcapsule particle comprises a housing and an embedded object encapsulated therein, the embedded object will largely volatilize from the housing at an escaping temperature greater than 250 degrees Celsius.

8. The removable adhesive layer of claim 7, wherein the resin composition comprises 100 parts by weight of the styrene-butadiene-styrene block copolymer, at least one of 1 parts by weight to 50 parts by weight of the plurality of hydrated inorganic substances and 5 parts by weight to 50 parts by weight of the plurality of microcapsule particles.

9. The removable adhesive layer of claim 7, wherein the styrene-butadiene-styrene block copolymer has a chemical structural formula of a degree of polymerization x is about 30 to about 90, a degree of polymerization y is about 10 to about 70, a degree of polymerization m and a degree of polymerization n each is a natural number greater than 1.

10. The removable adhesive layer of claim 7, wherein the plurality of hydrated inorganic substances is selected from at least one of aluminum hydroxide and magnesium hydroxide.

11. The removable adhesive layer of claim 7, wherein the embedded object is cis-Jasmone.

12. The removable adhesive layer of claim 7, wherein each of the plurality of microcapsule particles has a grain diameter of about 3 μm to about 12 μm.

13. An IC packaging process comprising:
providing an IC substrate comprising:
a carrier;
a circuit structure; and
a removable adhesive layer attached between the carrier and the circuit structure a styrene-butadiene-styrene block copolymer, the removable adhesive layer formed by curing a resin composition;
wherein the resin composition comprises a styrene-butadiene-styrene block copolymer, and the resin composition further comprises a plurality of hydrated inorganic substances and/or a plurality of microcapsule particles dispersed in the styrene-butadiene-styrene block copolymer, the plurality of hydrated inorganic substances dehydrate to form anhydrous inorganic substances at a dehydration temperature greater than 250 degrees Celsius, each of the plurality of microcapsule particle comprises a housing and an embedded object encapsulated therein, the embedded object will largely volatilize from the housing at an escaping temperature greater than 250 degrees Celsius;
mounting an integrated circuit on a side of the circuit structure 13 facing away from the carrier by a surface mount technology, the surface mount technology applying in a mounting temperature, wherein each of the dehydration temperature and the escaping temperature is greater than the mounting temperature;
encapsulating the integrated circuit on the IC substrate by a packaging structure to form an intermediate structure; and
heating the intermediate structure at a heating temperature greater than or equal to the dehydration temperature and/or the escaping temperature, to cause gas to be produced by the hydrated inorganic substances or the microcapsule particles and release from the removable adhesive layer;
peeling off the removable adhesive layer from the circuit structure.

14. The IC packaging process of claim 13, wherein the resin composition comprises 100 parts by weight of the styrene-butadiene-styrene block copolymer, at least one of 1 parts by weight to 50 parts by weight of the plurality of hydrated inorganic substances and 5 parts by weight to 50 parts by weight of the plurality of microcapsule particles.

15. The IC packaging process of claim 13, wherein the styrene-butadiene-styrene block copolymer has a chemical structural formula of a degree of polymerization x is about 30 to about 90, a degree of polymerization y is about 10 to about 70, a degree of polymerization m and a degree of polymerization n each is a natural number greater than 1.

16. The IC packaging process of claim 13, wherein the plurality of hydrated inorganic substances is selected from at least one of aluminum hydroxide and magnesium hydroxide.

17. The IC packaging process of claim 13, wherein the embedded object is cis-Jasmone.

18. The IC packaging process of claim 13, wherein each of the plurality of microcapsule particles has a grain diameter of about 3 μm to about 12 μm.

19. An IC substrate comprising:
a carrier;
a circuit structure; and
a removable adhesive layer attached between the carrier and the circuit structure a styrene-butadiene-styrene block copolymer, the removable adhesive layer formed by curing a resin composition;
wherein the resin composition comprises a styrene-butadiene-styrene block copolymer, and the resin composition further comprises a plurality of hydrated inorganic substances and/or a plurality of microcapsule particles dispersed in the styrene-butadiene-styrene block copolymer, the plurality of hydrated inorganic substances dehydrate to form anhydrous inorganic substances at a dehydration temperature greater than 250 degrees Celsius, each of the plurality of microcapsule particle comprises a housing and an embedded object encapsulated therein, the embedded object will largely volatilize from the housing at an escaping temperature greater than 250 degrees Celsius.

20. The IC substrate of claim 19, wherein the resin composition comprises 100 parts by weight of the styrene-butadiene-styrene block copolymer, at least one of 1 parts by weight to 50 parts by weight of the plurality of hydrated inorganic substances and 5 parts by weight to 50 parts by weight of the plurality of microcapsule particles.

* * * * *